US006979938B2

(12) United States Patent
Solberg

(10) Patent No.: US 6,979,938 B2
(45) Date of Patent: Dec. 27, 2005

(54) ELECTRONIC DEVICE FORMED FROM A THIN FILM WITH VERTICALLY ORIENTED COLUMNS WITH AN INSULATING FILLER MATERIAL

(75) Inventor: Scott E. Solberg, Mountain View, CA (US)

(73) Assignee: Xerox Corporation, Stamford, CT (US)

( * ) Notice: Subject to any disclaimer, the term of this patent is extended or adjusted under 35 U.S.C. 154(b) by 145 days.

(21) Appl. No.: 10/464,080

(22) Filed: Jun. 18, 2003

(65) Prior Publication Data

US 2004/0256948 A1 Dec. 23, 2004

(51) Int. Cl.[7] .................................................. H02N 2/00

(52) U.S. Cl. ...................... 310/358; 257/347; 117/902; 117/35

(58) Field of Search ............................... 310/357, 358; 257/347; 117/35, 902

(56) References Cited

U.S. PATENT DOCUMENTS

| | | | | | |
|---|---|---|---|---|---|
| 5,164,338 | A | * | 11/1992 | Graeger et al. | 438/50 |
| 6,013,970 | A | | 1/2000 | Nishiwaki et al. | 310/330 |
| 6,020,675 | A | * | 2/2000 | Yamashita et al. | 310/358 |
| 6,103,072 | A | * | 8/2000 | Nishiwaki et al. | 204/192.18 |
| 6,194,818 | B1 | * | 2/2001 | Sumi et al. | 310/311 |
| 6,362,511 | B1 | * | 3/2002 | Mizushima et al. | 257/412 |
| 6,711,793 | B2 | | 3/2004 | Sumi | 29/25.35 |
| 6,822,302 | B2 | * | 11/2004 | Higuchi et al. | 257/410 |

OTHER PUBLICATIONS

Shimomura, et al.; Preparation of Lead Zirconate Titanate Thin Film by Hydrothermal Method; Japanese Journal of Applied Physics; vol. 30, No. 9B, Sep. 1991, pp. 2174-2177.

Balaraman, et al.; Novel Hydrothermal Processing (<100 deg. C) of Ceramic-Polymer Composites for Integral Capacitor Applications; 2002 Electronic Components and technology Conference; pp. 1699-1703.

Vayssieres, et al.; Purpose-Built Anisotropic Metal Oxide Material: 3D Highly Oriented Microrod Array of ZnO; 2001 American Chemical Society; Pub'd on web Apr. 5, 2001.

* cited by examiner

*Primary Examiner*—Darren Schuberg
*Assistant Examiner*—J. Aguirrechea
(74) *Attorney, Agent, or Firm*—Fay Sharpe Fagan Minnich & McKee, LLP

(57) ABSTRACT

A thin film device comprises: a substrate and a thin film having a thickness formed on the substrate, wherein the thickness of the thin film is at least 1 micrometer, a crystal structure having crystals with a grain size formed within the thin film, wherein the grain size of a majority of the crystals includes a height to width ratio greater than three to two.

18 Claims, 9 Drawing Sheets

ELECTRONIC DEVICE FORMED FROM A THIN FILM WITH VERTICALLY ORIENTED COLUMNS WITH AN INSULATING FILLER MATERIAL

BACKGROUND

The present invention relates in general to a thin film device for use as a high specific energy electronic device, such as a capacitor, and a process for its manufacture. Specifically, the electronic device and method for manufacturing the electronic device involves hydrothermal deposition of a predominantly vertically oriented columnar (crystal) structured high dielectric constant film including an insulating filler material.

Useful inorganic materials with high dielectric constants are usually piezoelectric, but certain electrostrictive, ferroelectric, or anti-ferroelectric materials may be used for some applications. A common material with a high relative dielectric constant of much greater than 100, depending on composition, is lead zirconium titanate (hereinafter sometimes abbreviated as PZT). PZT is also strongly piezoelectric, and thus is also used in many electromechanical applications. Thin films of PZT are formed by various methods including physical vapor deposition (PVD) techniques such as sputtering, chemical vapor deposition (CVD) techniques, and chemical solution methods including sol-gel deposition. The chemical solutions may be applied for example by spin coating which is followed by a typical heat treatment (sintering) at a high temperature of 500–1000° C. to evaporate any solvent and to convert metal-organic precursors to inorganic materials. "Thick" film deposition methods, which are best used for films greater than about 10 microns thick, although thinner films of poorer quality have been used in commercial products, involve applying a mixture of powdered ceramic in an organic vehicle to a substrate and firing at very high temperature, at least 800° C., but preferably at least 1100° C. to obtain films with dielectric constants closer to bulk values. For reference, "bulk" material refers to the best available macroscopic sample with the same or similar material chemistry. Typically, because of the extremely high sintering temperatures used in the heat treatment, expensive electrode alloys of palladium or platinum are usually needed for best results.

The above-mentioned conventional piezoelectric thin film deposition methods are typically not economical for film thicknesses greater than one to two microns (also known as micrometers), and furthermore the thickest of such films can suffer from defects such as stress cracking. The "thick" film deposition methods produce relatively poor quality films, and furthermore require relatively expensive electrode materials.

Another approach for increasing the thickness of piezoelectric films is based on the use of hydrothermal synthesis which permits the intended reaction to proceed at a relatively low temperature (for example less than about 250° C.). Additionally, using the hydrothermal synthesis technique and low deposition temperatures a reduction in the electrode cost can be realized by using less expensive electrode materials. Previously reported hydrothermal synthesis techniques involve growing crystal of a piezoelectric material such as PZT on a compatible seed layer, for example titanium oxide, in a reactor with reagents containing for example Pb, Zr, and Ti, and a mineralizer such as potassium hydroxide, and heated to moderate temperatures of typically 120 degrees to 160 degrees C. Thick films can be formed at low temperatures by the hydrothermal synthesis technique, but the crystal grains produced are dependent on the orientation of the seed crystals, so that nearly randomly oriented seed crystals will produce a relatively low density film.

Accordingly, it is considered desirable to develop thin film devices (capacitors) with high specific energy, comparable to that of other capacitors such as aluminum electrolytic, or multi-layer ceramic capacitors, yet with lower energy loss than the aluminum electrolytic and lower manufacturing costs than the multi-layer ceramic capacitors. Current multilayer ceramic capacitors are manufactured using "thick" film methods such as screen printing or tape casting, thus such ceramic capacitors suffer from poor performance relative to bulk ceramics because the films are not fully dense, so that the resulting dielectric constant is typically less than one-half that of bulk.

SUMMARY

In accordance with the present invention, there is disclosed a thin film device and method for producing the device. One aspect of the present invention relates to a thin film device comprising a substrate and a thin film having a thickness formed on the substrate, wherein the thickness of the thin film is at least 1 micrometer. Additionally, the device comprises a crystal structure having crystals with a grain size formed within the thin film wherein the grain size of a majority of the crystals includes a height to width ratio that is greater than three to two.

In accordance with another aspect of the present invention, a method is provided for producing a piezoelectric thin film device, within a reactor vessel, having crystals vertically oriented therein, the method comprises the steps of preparing a substrate compatible with a hydrothermal growth process, depositing a seed layer onto the substrate, placing the substrate and at least one reagent into the vessel, closing the vessel and hydrothermally synthesizing the crystal structure, removing the substrate from the vessel, filling gaps between the crystals with a filler material, and applying a top electrode.

It is an object of the present invention to increase the breakdown voltage of the capacitor. Filling in the pores or gaps of hydrothermally deposited films with an insulator, for example, a polymer (or sol-gel ceramic) can increase the breakdown voltage of the capacitor. The energy stored within a capacitor increases with the voltage squared, thus filled films provide dramatically improved specific energies. Filling the gaps between vertically oriented crystal grains of, for example, ferroelectric with a polymer is useful because the polymer increases the breakdown voltage of the device relative to having ambient (humid) air in the crevices.

Additionally, it is another object of the present invention to provide a thin film vertical columnar structure which allows most of the high dielectric constant material to extend between the top and bottom electrodes, so that the insulator which fills the crevices does not sandwich between the high dielectric constant material and the electrode which would reduce the effective dielectric constant and thus the capacitance of the final device. Thus, it is desirable to concentrate the insulating filler alongside, not above or below, the columnar structure.

Other benefits and advantages of the subject invention will become apparent to those skilled in the art upon a reading and understanding of the specification.

BRIEF DESCRIPTION OF THE DRAWINGS

The invention may take physical form in certain parts and steps and arrangements of parts and steps, the preferred embodiments of which will be described in detail in the specification and illustrated in the accompanying drawings which form a part hereof and wherein.

DETAILED DESCRIPTION

Figure 1:
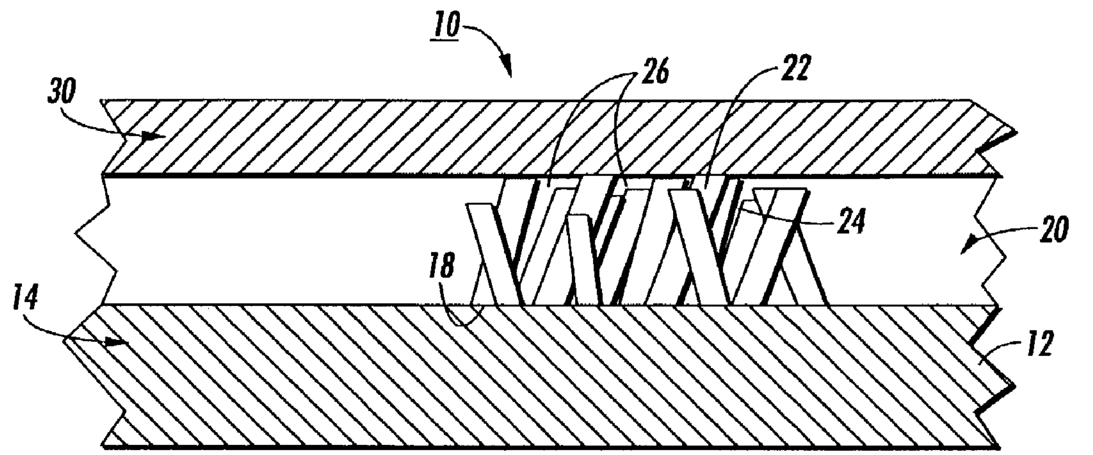
FIG. 1 is a schematic cross-section of the thin film device according to the present invention.
Figure 2:
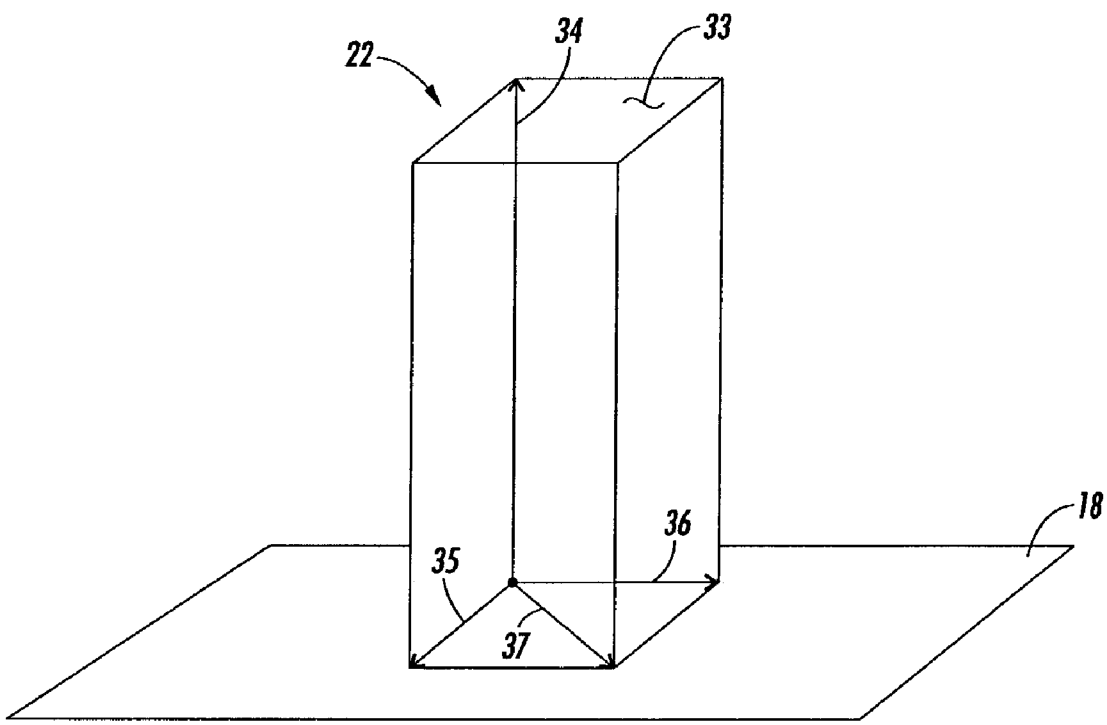
FIG. 2 is a schematic view of a tetragonal crystal according to the present invention.
Figure 5:
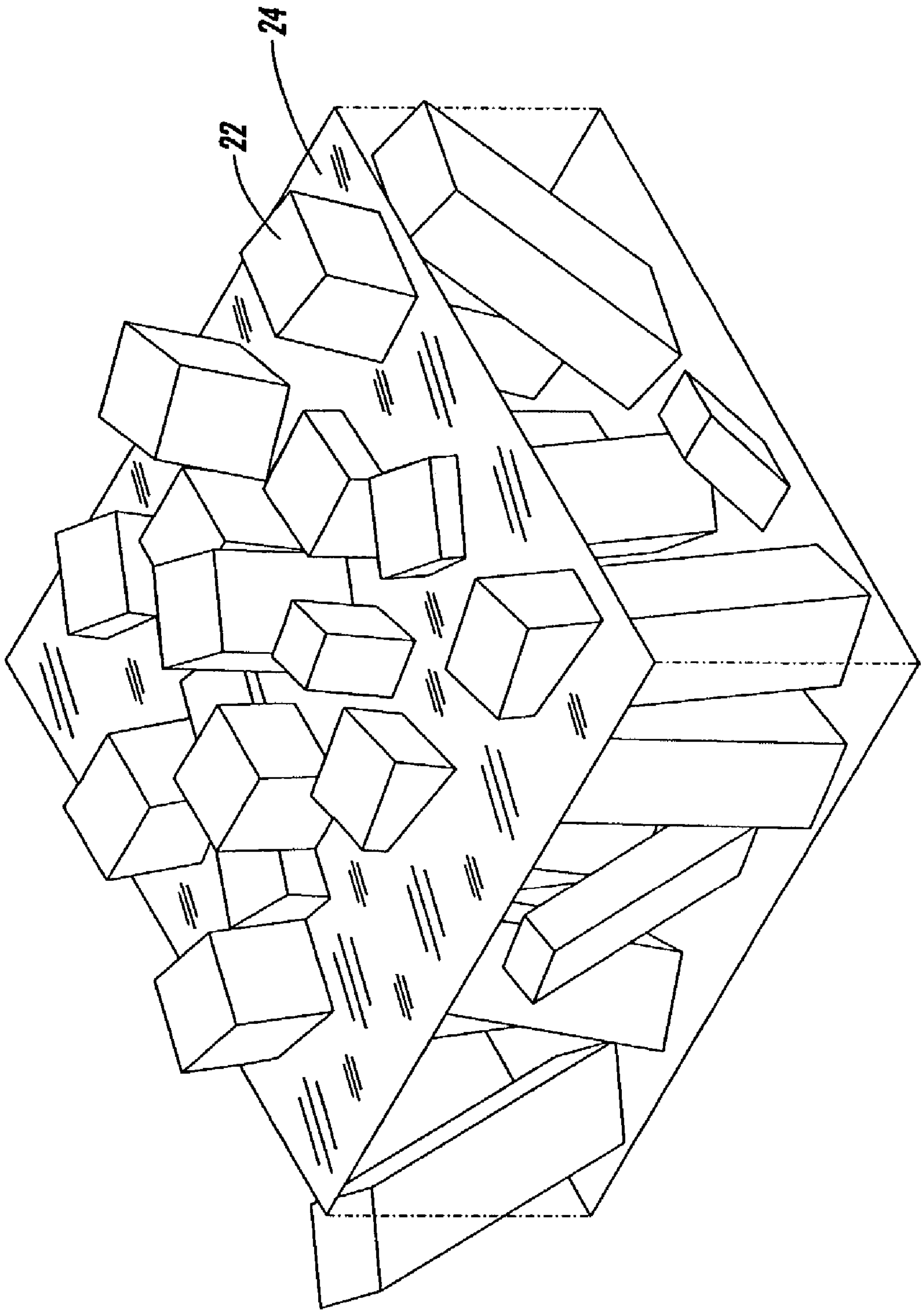
FIG. 5 is a perspective view of crystals exhibiting predominantly highly ordered vertical growth including an epoxy fill therebetween according to the present invention.

Referring now to the drawings, wherein the showings are for the purposes of illustrating a preferred embodiment of the invention only and not for purposes of limiting same. FIG. 1 shows a schematic cross-section of the high dielectric constant thin film electronic device, such as capacitor 10 with a bottom or lower electrode 12 embedded in or coated on the surface of the substrate 14. A chemically and structurally suitable seed layer 18 can be deposited, for example, from a chemical solution using, for example, spin or dip coating. A hydrothermal deposition of a main, for example, ferroelectric layer-thin film 20 is shown, which in one embodiment is at least 1 micrometer. Using a hydrothermal synthesis process produces mostly vertically-oriented columnar crystal growth structures 22 (as depicted in FIG. 2). Also shown in FIG. 1 is an insulating filler material 24, which can be, for example a polymer or sol-gel ceramic, located in gaps 26 between the ferroelectric columns 22, and a top or upper electrode 30 formed by, for example, physical vapor deposition. In a preferred embodiment, the device 10 has both an upper electrode 30 and a lower electrode 12 for electrically charging the thin film 20. The film 20 composition may be tailored to maximize the amount of charge stored or to minimize the dielectric loss, so for example various piezoelectric, anti-ferroelectric, or electrostrictive materials may be used. Filling in the pores or gaps 26 of hydrothermally deposited films 20 with the insulating filler material 24 increases the breakdown voltage of the capacitor 10. Since stored energy increases with voltage squared, filled films 20 will dramatically improve specific energies. Filling in the gaps between vertically-oriented <001> ferroelectric crystal grains 22 with a, for example, polymer 24 (see FIG. 5) increases the breakdown voltage of the device 10 relative to having ambient (likely humid) air in the gaps 26. Significantly, the insulating filler 24 has the additional benefit of even allowing larger gaps 26 due to missing grains (not shown) in the ferroelectric film 20, for example, from defects that occur in the hydrothermal growth process, because such gaps 26 in the ferroelectric film 20 would have only small effects on the device capacitance, provided that they constitute a small fraction of the total device area, but would otherwise undesirably and potentially catastrophically lower the device breakdown voltage.

Figure 3:
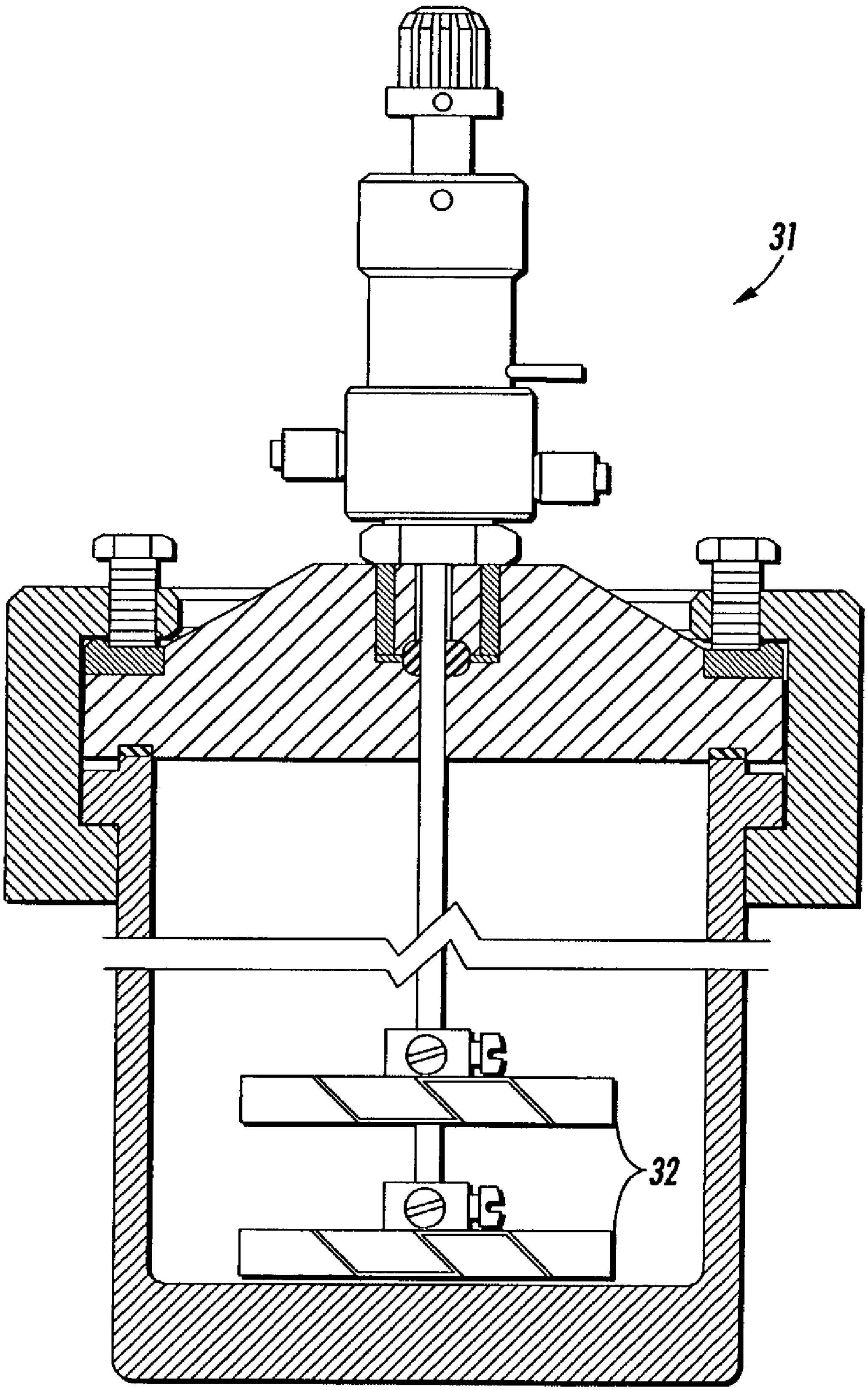
FIG. 3 is a partial cross-section of a reactor vessel.
Figure 6:
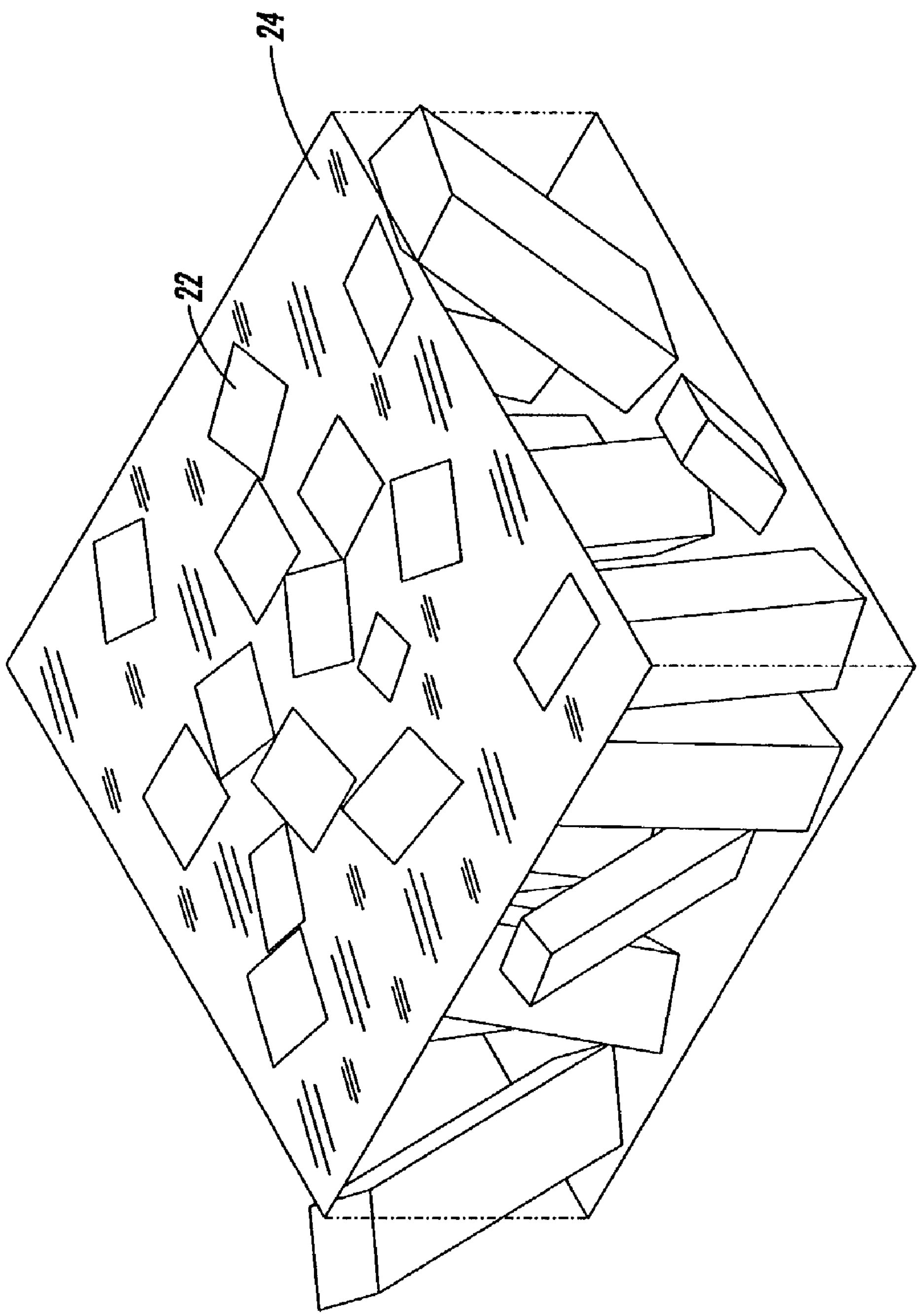
FIG. 6 is a perspective view of crystals exhibiting predominantly highly ordered vertical growth including an epoxy fill whereby the surface has been cut and polished according to the present invention.

The sequence of steps in the manufacture of the piezoelectric thin film device 10 are described below. Initially, the process starts with a substrate 14, preferably with a uniform crystal texture including, for example, a metal sheet. The bottom electrode 12 may be the substrate 14 or a thin metal coating or sheet on the substrate 14. The metal coating or metal sheet can be, for example, stainless steel, platinum, or nickel. Examples of bottom electrode 12 include, but are not limited to, 1) a randomly textured surface, 2) a predominantly <111> textured platinum electrode, and 3) a predominantly <100> textured cubic electrode with compatible structural match to the seed layer and hydrothermally grown ferroelectric material. Next a chemical solution or other low-cost method is used to apply the seed layer 18. The seed layer 18 employed may have a thickness of 500 nm (0.5 micrometer) or less. The seed layer 18 is desirably oriented in the (100) plane for subsequent hydrothermal growth of pseudo-cubic high dielectric constant materials. Next, a film 20 is hydrothermally deposited on one side or both sides of the substrate 14 simultaneously. The substrate 14, seed layer 18, and film 20 is placed in a high temperature, high pressure reactor vessel, for example, a Parr Instruments floor stand reactor vessel 31 (see FIG. 3). In one embodiment, the vessel is closed and heated to approximately 160° C. for a period of approximately 14 hours, after which the substrates are removed for subsequent processing. Epitaxial grain growth occurs during the heating process resulting in a crystal structure 22 having crystals with a grain size formed within the thin film 20. The grain size of the crystals is predominantly less than about 2 micrometers across (width) and approximately 12–16 micrometers tall (height). It is to be appreciated however, that for other crystals the height to width ratio may be different, although this height to width ratio is preferably greater than three to two. The gaps 26 in the film 20 are then filled with a liquid (or gel) filler material 24, for example an epoxy, then cured, and then lightly polished (optional step). Polishing is done to planarize the top surface (FIG. 6) of the composite structure. Sputtering or another low-cost method is used to apply a top electrode 30 and finally, the device 10 may be cut, sampled, and packaged. The steps outlined above will be described in more detail hereinafter.

Figure 4:
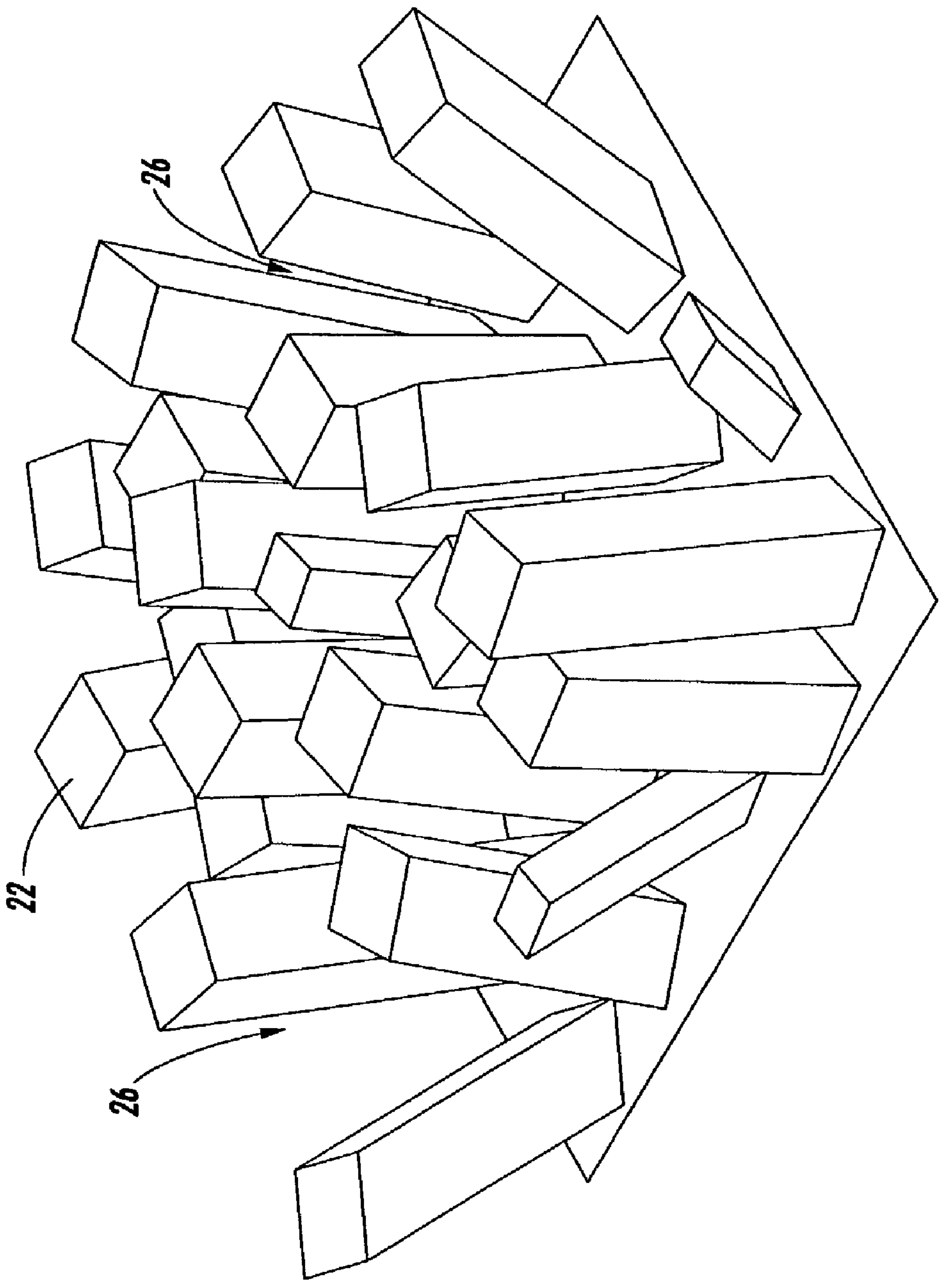
FIG. 4 is a perspective view of crystals exhibiting predominantly highly ordered vertical growth according to the present invention.

Hydrothermal processing involves the synthesis of inorganic compounds, usually oxides, in an aqueous, elevated temperature (typically up to 250° C.), and elevated pressure environment. One hydrothermal processing recipe used to produce an embodiment of tetragonal-rod-configured crystal 22 growth (see FIGS. 2 and 4) involved the following ingredients and methods. A mixture of 1.4 milliliters zirconium propoxide and 1 milliliter titanium isopropoxide, 15 grams lead acetate trihydrate, 500 milliliters of 45 weight percent potassium hydroxide, and 2.4 liters deionized water was added to a four liter, high temperature, high pressure, reactor vessel made by Parr Instruments. The vessel 31 was closed and heated to about 160° C., whereby the pressure was allowed to build to approximately 6 atmospheres. The reactor 31 was stirred with an impeller 32 at 30 rpms for 14 hours. The resultant thin film 20 was then rinsed in deionized water. The Parr reactor 31 used in the synthesis was a Model 4551 "1 Gallon Reactor". The crystals 22 that were grown (refer to FIGS. 2 and 4) grew epitaxially from the seed layer 18 and are oriented predominantly in the (001) plane 33. The grown crystals 22 in this example have a tetragonal crystal structure and because they are predominantly oriented along the <001> direction 34, resemble rectangular rods or posts because they are much taller than wide (FIGS. 2 and 4). It is to be appreciated that the extent of growth direction <001> 34 is greater than, for example, the extent of growth directions <100> 35, <010> 36, and <110> 37. Most of the useful high dielectric constant materials have slightly distorted cubic structures, for example tetragonal, rhombohedral, or monoclinic structures. Thus, for example the tall, vertically oriented structures useful for the present invention grow along the <001> direction 34 for tetragonal materials.

Filling in the pores or gaps 26 of hydrothermally deposited films (see FIG. 5) with the filler material 24, such as a polymer or sol-gel ceramic, has the effect of increasing the mechanical strength and breakdown voltage of the capacitor 10. One way to increase the energy storage capacity of a capacitor is to increase the voltage across the capacitor, because energy goes up in relation to the square of the voltage. Filled films increase the voltage stress capability which allows higher voltages and therefore provides dramatically improved specific energies of the capacitor 10. The microstructure of the film 20 and the polymer 24 infiltration allows the synthesis of reliable films 20 with high dielectric constant and low dielectric loss.

An advantage of the vertical columns which predominantly extend from the bottom to top electrodes, compared to the more common randomly oriented hydrothermally grown crystals, is that the majority of the lower dielectric constant filler material is not between an electrode and the high dielectric material, but rather adjacent to the high dielectric material. Thus in the electrical circuit, with the vertically oriented columns the low dielectric constant filler material is in parallel with the high dielectric constant material, so any capacitance reduction is linearly proportional to the ratio of filler to high dielectric constant material, whereas if the high dielectric constant material were randomly oriented, then some of the filler material would be in series, so the device capacitance would be significantly reduced, typically by at least a factor of ten, depending on the relative dielectric constants. Typical filler polymers would have relative dielectric constants <10, whereas useful high dielectric hydrothermally grown materials would have relative dielectric constants >100. For reference, the formula for calculating the overall capacitance (Cp) of these capacitors in parallel is:

$$Cp(\text{overall})=C(\text{crystal columns})+C(\text{filler})$$

with the overall capacitor area divided between the area of the high dielectric constant columns and the filler, whereas the formula for calculating the overall capacitance (Cs) of capacitors in series (i.e. less desirable configuration) is:

$$1/Cs(\text{overall})=1/C(\text{crystal columns})+1/C(\text{filler})$$

with the thickness in each section of the film divided between the high dielectric material and the filler.

High voltage power supply applications require capacitors 10 with thick films to keep electrical fields less than about 50 volts per micron. Currently, it is expensive to vapor deposit films greater than about 1 micron. Additionally, it is difficult to get quality films less than 10 microns with "thick film" processes employing powdered ceramics in an organic binder. Such "thick" films are often applied by screen printing, and subsequently fired at high temperature, at least 900° C., but even higher temperatures are desired to further densify the films and thus increase the dielectric constant. Extremely high temperatures place limitations on the materials used in the "thick" film devices, often requiring expensive noble metal electrodes for example. The hidden pores in screen printed films cannot be effectively filled with a liquid or gel, thus screen printed films must rely on inherent breakdown voltage of the ferroelectric film. In contrast, hydrothermally deposited films 20 (e.g. vertical type growth) have high quality crystals 22 for maximum dielectric constant when filled with insulator. It is to be appreciated that the vertical growth is not a 'perfectly' vertical growth, but rather a predominantly vertical growth. Effective capacitance is proportional to ferroelectric film coverage.

Figure 7:
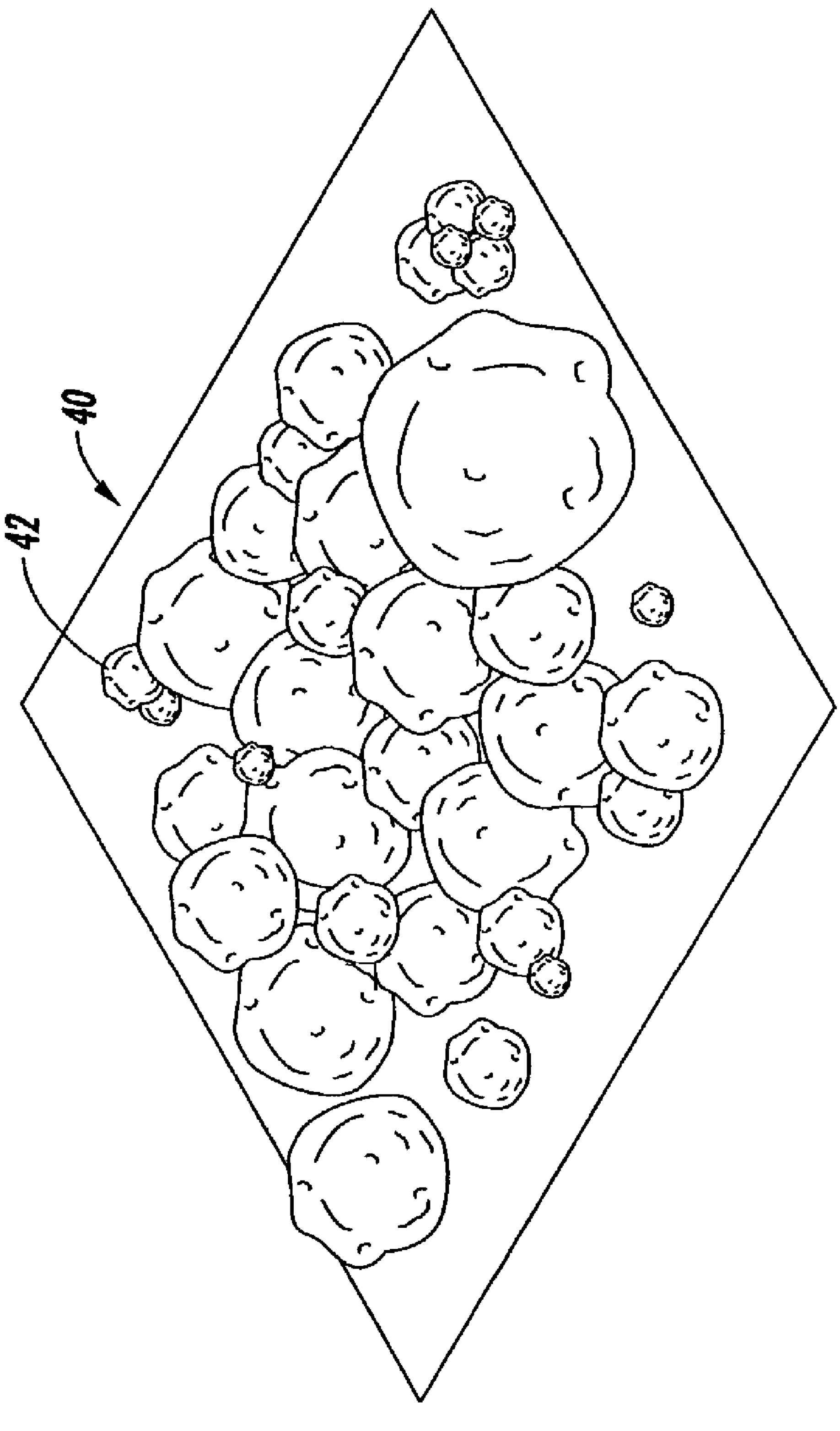
FIG. 7 is a perspective view of crystals with poorly ordered growth.
Figure 8:
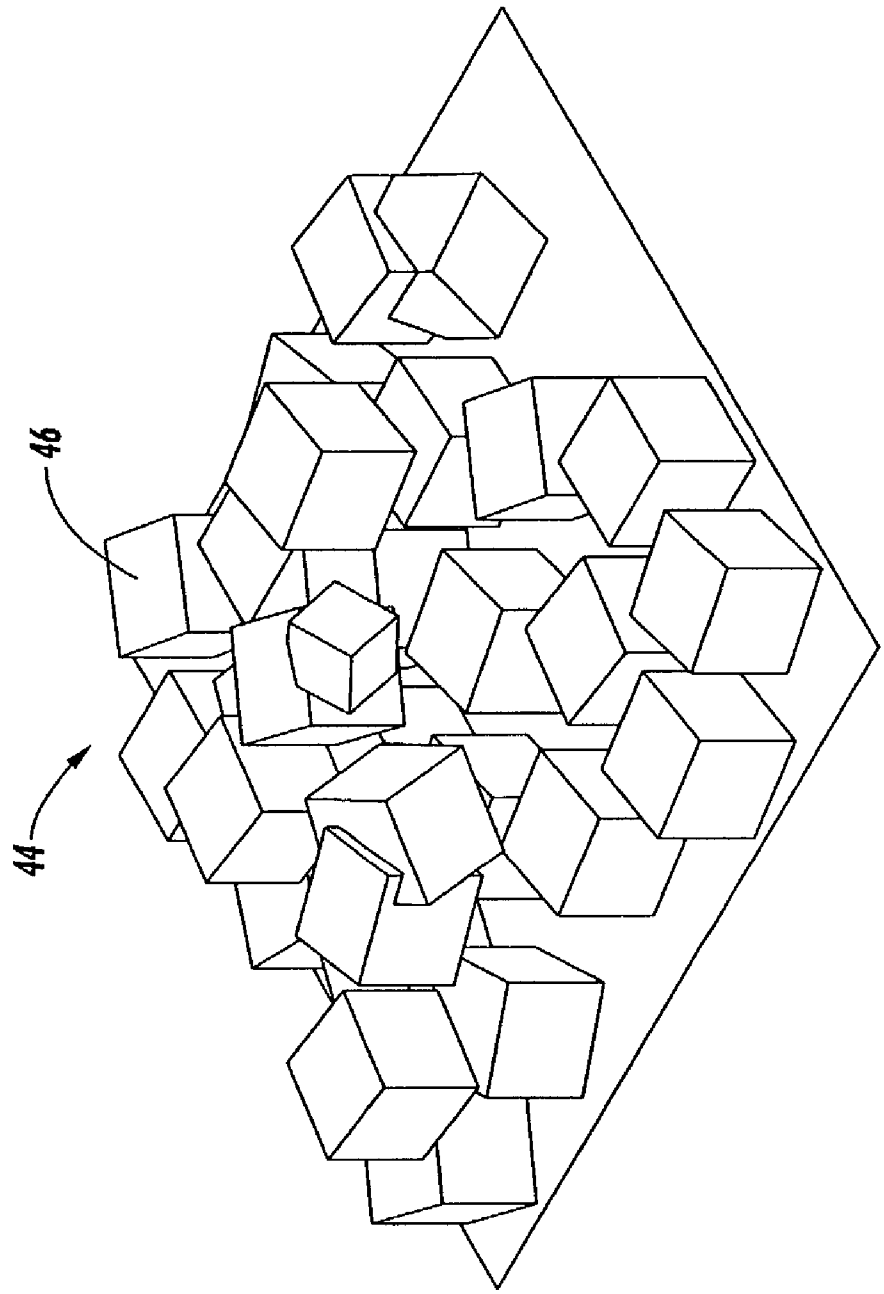
FIG. 8 is a perspective view of crystals exhibiting ordered growth.

Various reagent concentrations may result in less than desirable growth morphologies (grain growth). Specifically, different PZT growth morphologies are displayed in FIGS. 7 and 8. The growth morphologies can be described as "boulders" 40 and "cubes" 44, respectively. The different growth morphologies 40, 44 result from the fact that there is both growth and etching occurring. The boulder growth morphology 40 results in a fairly random crystal alignment 42 with less ordered lattices (poorly ordered growth). The growth morphology 44 results in crystals 46 exhibiting ordered cubic growth.

The growth of highly <001> textured crystals 22, may result from a random textured seed layer 16 under appropriate growth conditions via a survival-of the-fittest mechanism, because the <001> oriented grains can grow taller faster than grains of other orientations, however the packing density of such columns is reduced when disordered seed layers are used.

Figure 9:
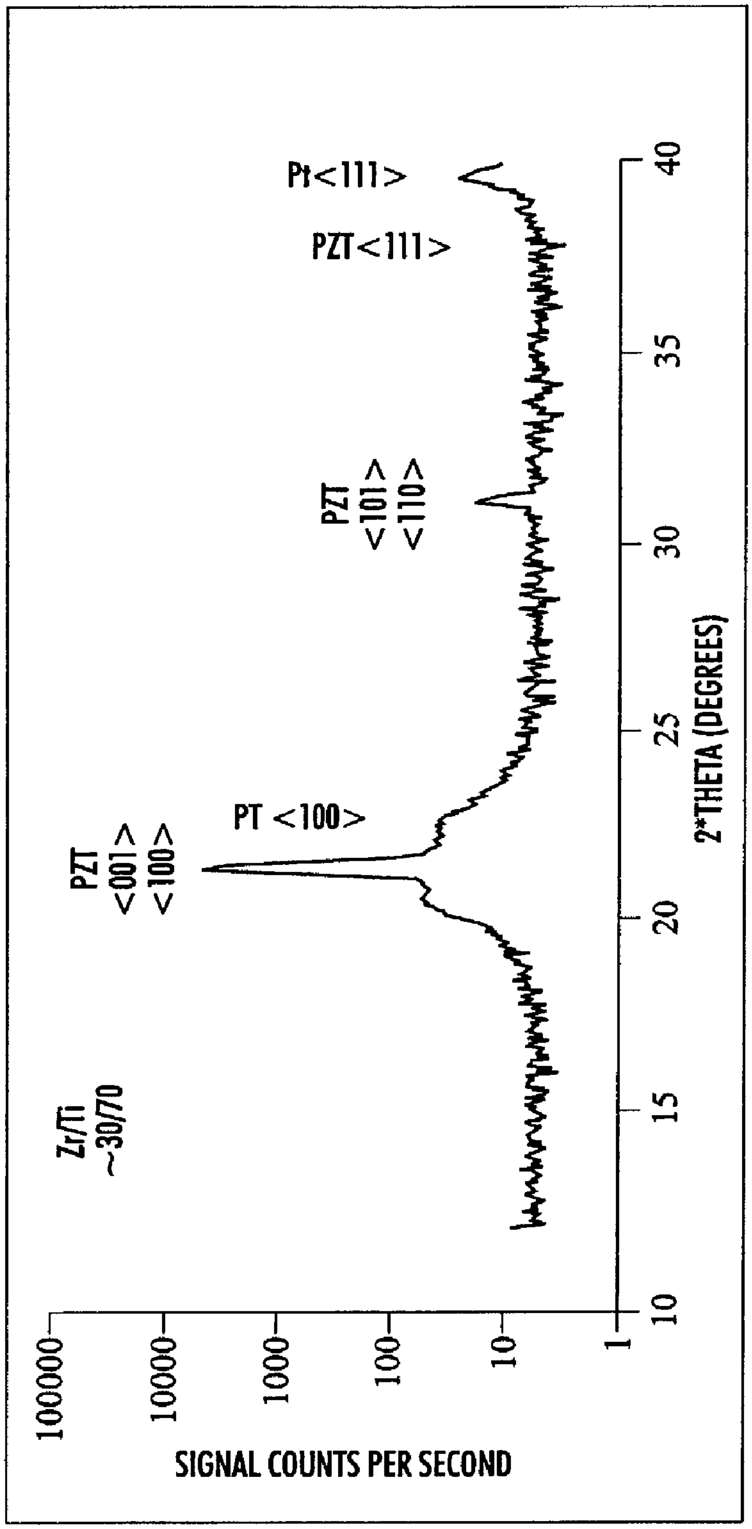
FIG. 9 is an x-ray diffraction spectrum of a sample with crystals exhibiting predominantly highly ordered vertical growth according to the invention; and, FIG. 10 is a graph showing electrical measurements of epoxy-filled and polished hydrothermal PZT according to the present invention.

An x-ray diffraction spectrum of hydrothermal PZT 30/70, i.e. atomic % Zr/(atomic % Zr+atomic % Ti)=30%, according to the present invention, but without polymer fill, is shown in FIG. 9. This measurement confirms the predominant <001> crystal texture versus other textures such as <101> and <110>.

Figure 10:
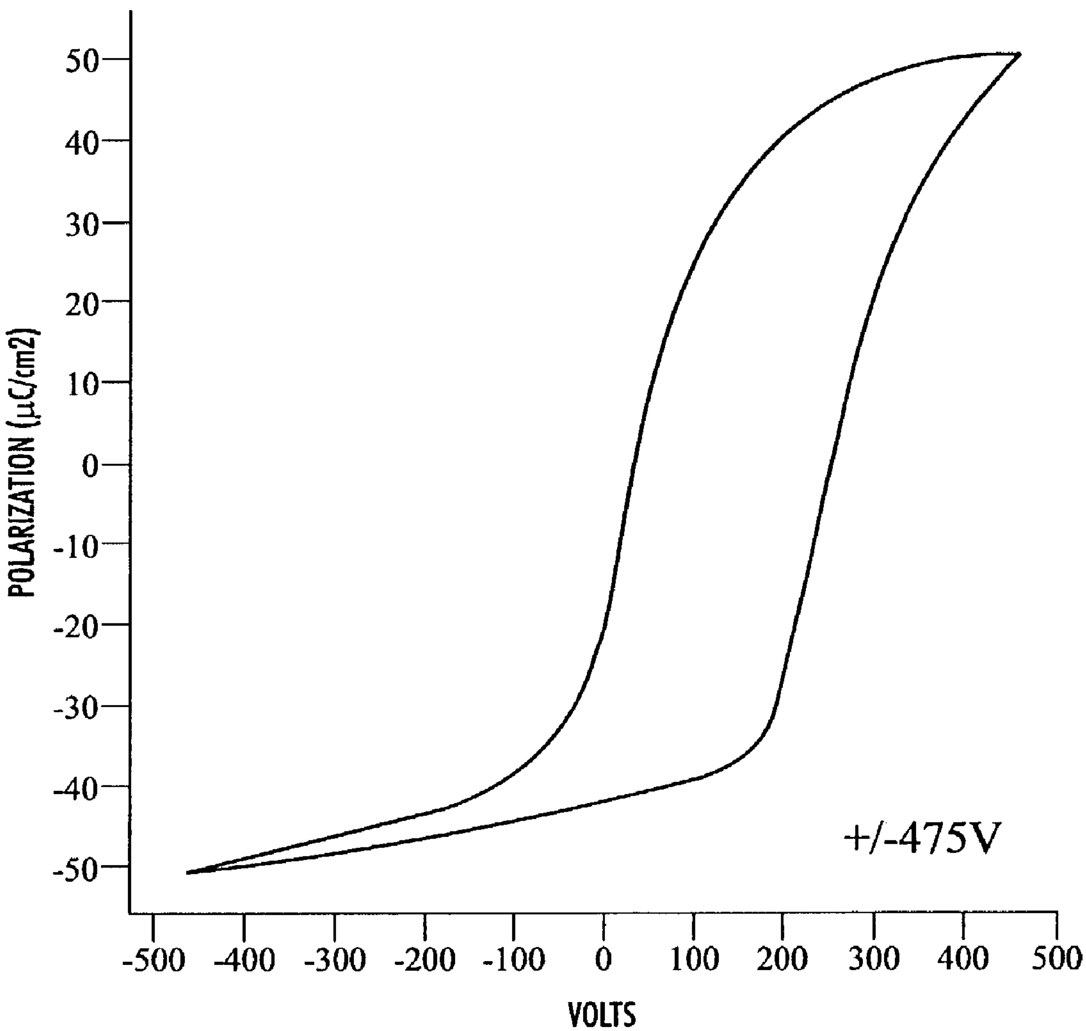

A hysteresis loop (polarization vs. volts) is displayed in FIG. 10 showing electrical measurements of an epoxy filled and polished hydrothermal PZT 30/70 (zirconium to titanium) on stainless steel according to the present invention. The measurements were taken from a sample approximately 14 microns thick and utilized gold in the top electrode.

While particular embodiments have been described, alternatives, modifications, variations, improvements, and substantial equivalents that are or may be presently unforeseen may arise to applicants or others skilled in the art. Accordingly, the appended claims as filed, and as they may be amended, are intended to embrace all such alternatives, modifications, variations, improvements, and substantial equivalents.

Having thus described the invention, it is claimed:

1. A thin film device comprising:

a substrate;

a thin film having a thickness formed on said substrate, wherein said thickness of said thin film is at least 1 micrometer; and, a crystal structure having crystals with a grain size formed within said thin film, wherein said grain size of a majority of said crystals includes a height to width ratio that is greater than three to two.

2. The thin film device according to claim 1, wherein said crystals are synthesized using a hydrothermal method.

3. The thin film device according to claim 1, wherein said crystals have a rod configuration oriented predominantly in the (001) plane.

4. The thin film device according to claim 2, wherein said crystals have a rod configuration oriented predominantly in the (001) plane.

5. The thin film device according to claim 3, wherein said crystal structure of said rods is tetragonal.

6. The thin film device according to claim 1, wherein said thin film is at least one of piezoelectric, electrostrictive, ferroelectric, or anti-ferroelectric material.

7. The piezoelectric thin film device according to claim 6, further comprising:

upper and lower electrode portions provided on respective upper and lower surfaces of said thin film for applying an electric field thereto, wherein said crystals extend from said lower surface to said upper surface.

8. The thin film device according to claim 6, wherein said substrate includes a metal sheet.

9. The thin film device according to claim 6, wherein said substrate includes a metal-coated sheet.

10. The thin film device according to claim 6, wherein said thin film includes a seed layer deposited on said substrate.

11. The thin film device according to claim 10, wherein a thickness of said seed layer is less than 500 nm.

12. The thin film device according to claim 10, wherein said crystals of said structure of said thin film are grown generally perpendicular to said seed layer.

13. The thin film device according to claim 12, wherein said thin film has a crystal growth structure oriented such that the extent of growth direction <001> is greater than extent of growth directions <100>, <010>, and <111>.

14. The thin film device according to claim 12, wherein said thin film includes gaps between said crystals, said gaps include an insulating filler material therein.

15. The thin film device according to claim 14, wherein said filler material is in the form of a liquid or a gel to fill said gaps between said crystals, said liquid or said gel being curable into a solid.

16. The thin film device according to claim 12, wherein said thin film includes zirconium, titanium, and lead.

17. A thin film device comprising:

a substrate;

a thin film having a thickness formed on said substrate, wherein said thickness of said thin film is at least 1 micrometer;

a crystal structure having crystals with a grain size formed within said thin film, wherein said grain size of a majority of said crystals includes a height to width ratio that is greater than three to two; and, said crystals oriented predominantly in the (001) plane.

18. A thin film device comprising:

a substrate;

a thin film having a thickness formed on said substrate, wherein said thickness of said thin film is at least 1 micrometer;

a crystal structure having crystals with a grain size formed within said thin film, wherein said grain size of a majority of said crystals includes a height to width ratio that is greater than one; and, said thin film has a crystal growth structure oriented such that the extent of growth direction <001> is greater than extent of growth directions <100>, <010>, and <110>.

* * * * *